(12) United States Patent
Zhang

(10) Patent No.: US 8,085,065 B2
(45) Date of Patent: Dec. 27, 2011

(54) DUAL LOOP LEVEL SHIFTER

(75) Inventor: Hanzhen Zhang, Scarborough (CA)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 12/647,035

(22) Filed: Dec. 24, 2009

(65) Prior Publication Data

US 2011/0156753 A1    Jun. 30, 2011

(51) Int. Cl.
*H03K 19/094* (2006.01)

(52) U.S. Cl. .............................. 326/68; 326/81; 326/86

(58) Field of Classification Search ............. 326/63, 326/68–83, 86, 87; 327/333, 108–109; 365/189.02, 365/189.05
See application file for complete search history.

(56) References Cited

U.S. PATENT DOCUMENTS

| | | | | |
|---|---|---|---|---|
| 5,019,724 A * | 5/1991 | McClure | ........................ | 326/29 |
| 6,232,794 B1 * | 5/2001 | Cox | ................. | 326/81 |
| 6,563,357 B1 * | 5/2003 | Hsu et al. | ....................... | 327/212 |
| 7,061,273 B2 * | 6/2006 | Wang et al. | .................... | 326/86 |
| 7,091,742 B2 * | 8/2006 | Ryan | ................................ | 326/27 |
| 7,176,720 B1 * | 2/2007 | Prather et al. | .................... | 326/80 |
| 7,268,588 B2 * | 9/2007 | Sanchez et al. | ................. | 326/68 |
| 7,511,552 B2 * | 3/2009 | Ali et al. | ........................ | 327/333 |
| 7,609,090 B2 * | 10/2009 | Srivastava et al. | ............... | 326/80 |
| 7,733,126 B1 * | 6/2010 | Choy et al. | ........................ | 326/68 |
| 2008/0008011 A1 * | 1/2008 | Moon et al. | ............. | 365/189.02 |

* cited by examiner

*Primary Examiner* — Shawki S Ismail
*Assistant Examiner* — Crystal L Hammond
(74) *Attorney, Agent, or Firm* — Volpe and Koenig, P.C.

(57) ABSTRACT

A method and apparatus are disclosed to control one or more input output (I/O) pads. An input signal is translated to an output signal having a desired logic level using a first latch loop. The state of the first latch loop is maintained by a second latch loop, integrated with the first latch loop, when a latching indication is received. The integration between the first latch loop and the second latch loop is such that the second latch loop creates an input-output connection if transmission gates in the second latch loop are conductive, and disables the input-output connection if the transmission gates are not conductive.

16 Claims, 5 Drawing Sheets

DUAL LOOP LEVEL SHIFTER

FIELD OF INVENTION

This application is related to computer systems.

BACKGROUND

Processing devices, such as central processing units (CPUs) and graphics processing units (GPUs), in computer systems may be powered from different supply voltages. Core processing logic that processes data and generates command signals to an external device in a GPU, may be powered by a first supply voltage, while input/output (I/O) logic that drives the command signals onto I/O pads may be powered by a second supply voltage.

To facilitate the communications between the digital core and the I/O pads/blocks that are using the different power supply, a level shifter circuit is designed and inserted in between the core blocks and the I/O pads/blocks. Current level shifter designs are based on either a PMOS/NMOS cross latch loop, or an inverter cross latch loop. For each of these designs, only one latch loop is used, and acts as an uncontrolled pass through voltage level translator.

An example of a single loop level shifter is illustrated in FIG. 1. The level shifter 10 comprises a PMOS transistor 11 and an NMOS transistor 12, connected in series to power voltage Vdd and ground Vss. A PMOS transistor 13 and NMOS transistor 14 are connected to PMOS transistor 11 and NMOS transistor 13 in a latch form and are connected in series between the power voltage Vdd and ground Vss.

The gate of the PMOS transistor 11 is coupled to a voltage output Vout. The gate of the PMOS 13 is connected to the drain of the NMOS 12. The gate of the NMOS 12 is connected to receive an input signal Vin, and the gate of the NMOS 14 is connected to the input signal Vin by an inverter 15.

When an input voltage is applied to Vin, the NMOS 12 and the PMOS 13 are turned on, and the PMOS 11 and the NMOS 14 are turned off. The output signal Vout is therefore a high voltage signal.

When a 0V signal is the input signal Vin, the NMOS 14 and the PMOS 11 are turned on, and the NMOS 12 and the PMOS 13 are turned off. The output signal Vout is therefore a low voltage signal.

Known designs, such as the one illustrated in FIG. 1, may not have the controllable output latching feature. This feature is important in some situations when a constant output of the level shifter is required regardless of the input of the level shifter. For example, in a core re-power-up sequence, the core may not be in a regular working state during this period of time, and the control signal from the core to the I/O pads/blocks may not be correct and meaningful. Pass through level shifters will simply pass the incorrect control signals direct to the I/O pads/blocks, which may result in a malfunction and unpredictable situation. In this scenario, a level shifter with latched output may be used to maintain the I/O pads/blocks pre-set condition until the core is fully powered up and getting into a normal working state.

Known single loop level shifter that support a controllable output latching feature suffer from the glitch and uncertainty when the shifter restores from the latching state to the normal working state which follows the input. Other drawbacks that known designs may have include larger silicon area, more power, complexity, and relatively more duty cycle distortion.

Accordingly, there exists a need for an improved method and apparatus that overcome the above problems encountered by the current level shifters, including the level shifting function and controllable output latching.

SUMMARY

A method and level shifter are disclosed to control one or more input output (I/O) pads. An input signal is translated to an output signal having a desired logic level using a first latch loop. The state of the first latch loop is maintained by a second latch loop, integrated with the first latch loop, when a latching indication is received.

BRIEF DESCRIPTION OF THE DRAWINGS

A more detailed understanding may be had from the following description, given by way of example in conjunction with the accompanying drawings wherein.

DETAILED DESCRIPTION

Although the features and elements are described in particular combinations, each feature or element can be used alone, without the other feature or elements, or in various combinations with or without other features and elements.

Figure 1:
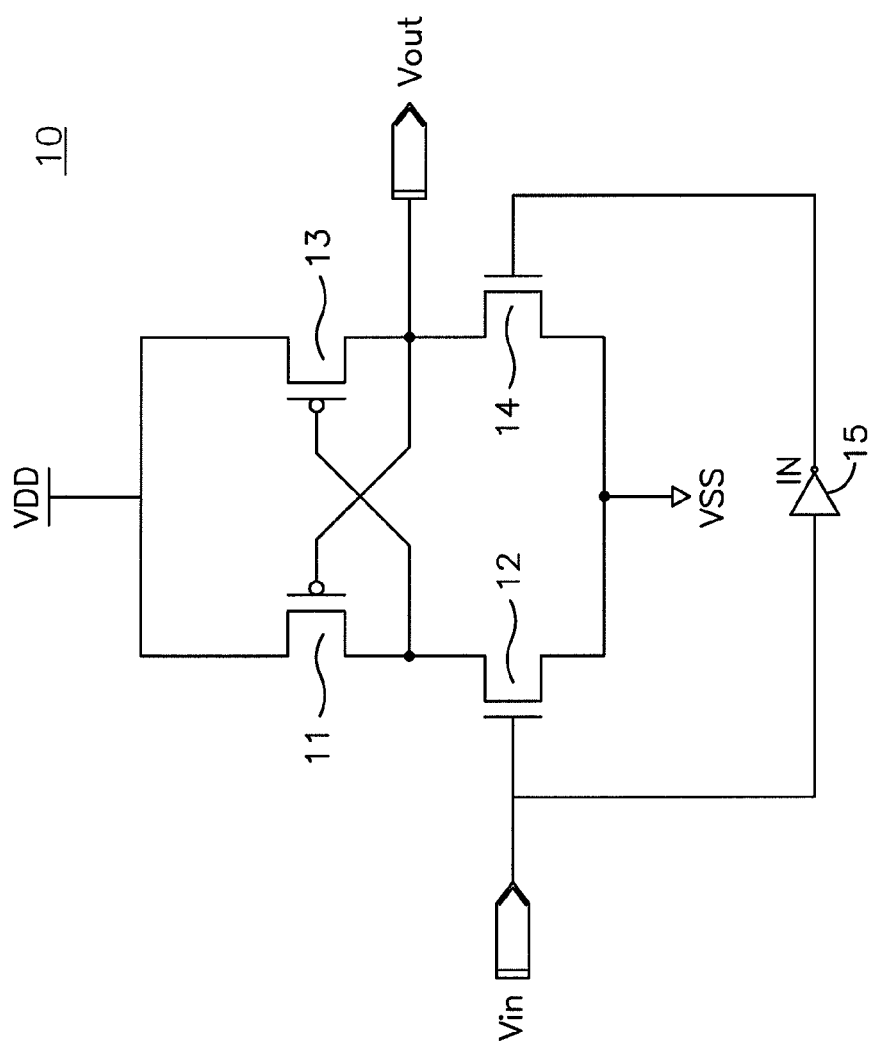
FIG. 1 shows an example prior art single loop level shifter.
Figure 2:
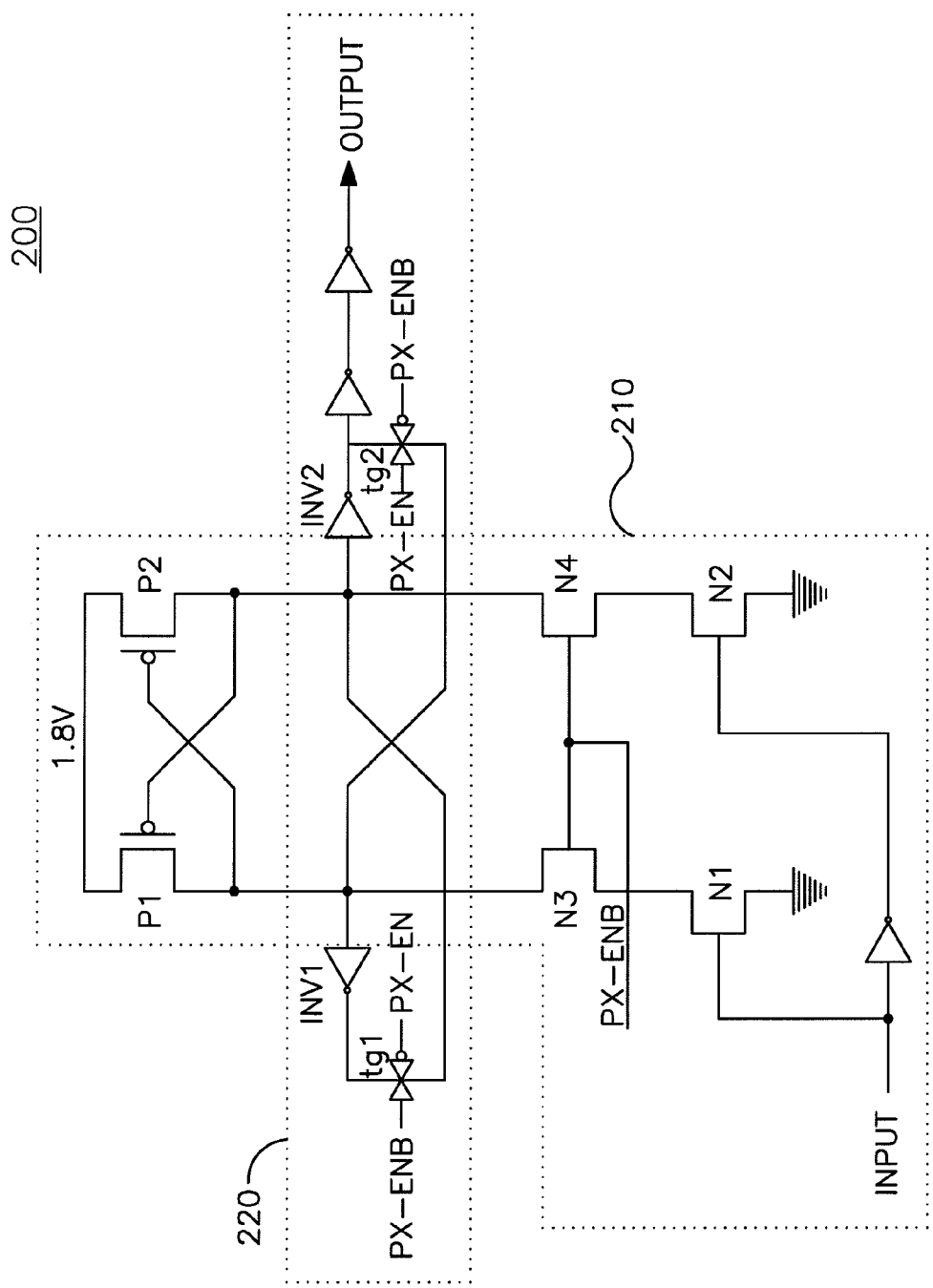
FIG. 2 shows an example dual loop level shifter as disclosed.

In accordance with a disclosed method and apparatus, a dual loop level shifter is shown in FIG. 2. The disclosed level shifter 200 comprises two cross latch loops that are integrated together, a PMOS/NMOS crosslatch loop 210 and an inverter cross latch loop 220. The PMOS/NMOS cross latch loop 210 comprises PMOS transistors P1, P2 and NMOS transistors N1, N2, N3, and N4. The inverter loop 220 comprises inverters inv1, inv2, and transmission gates tg1, tg2. The inverter inv1 and inv2 create an output to input connection through transmission gate tg1 and tg2. When tg1 and tg2 are conductive, inv1 and inv2 are feeding each other's input with its own output and making a firm latch. Once tg1 and tg2 are no longer conductive, the output-input feeding will be disconnected and the inverter loop will be broken up.

Figure 3:
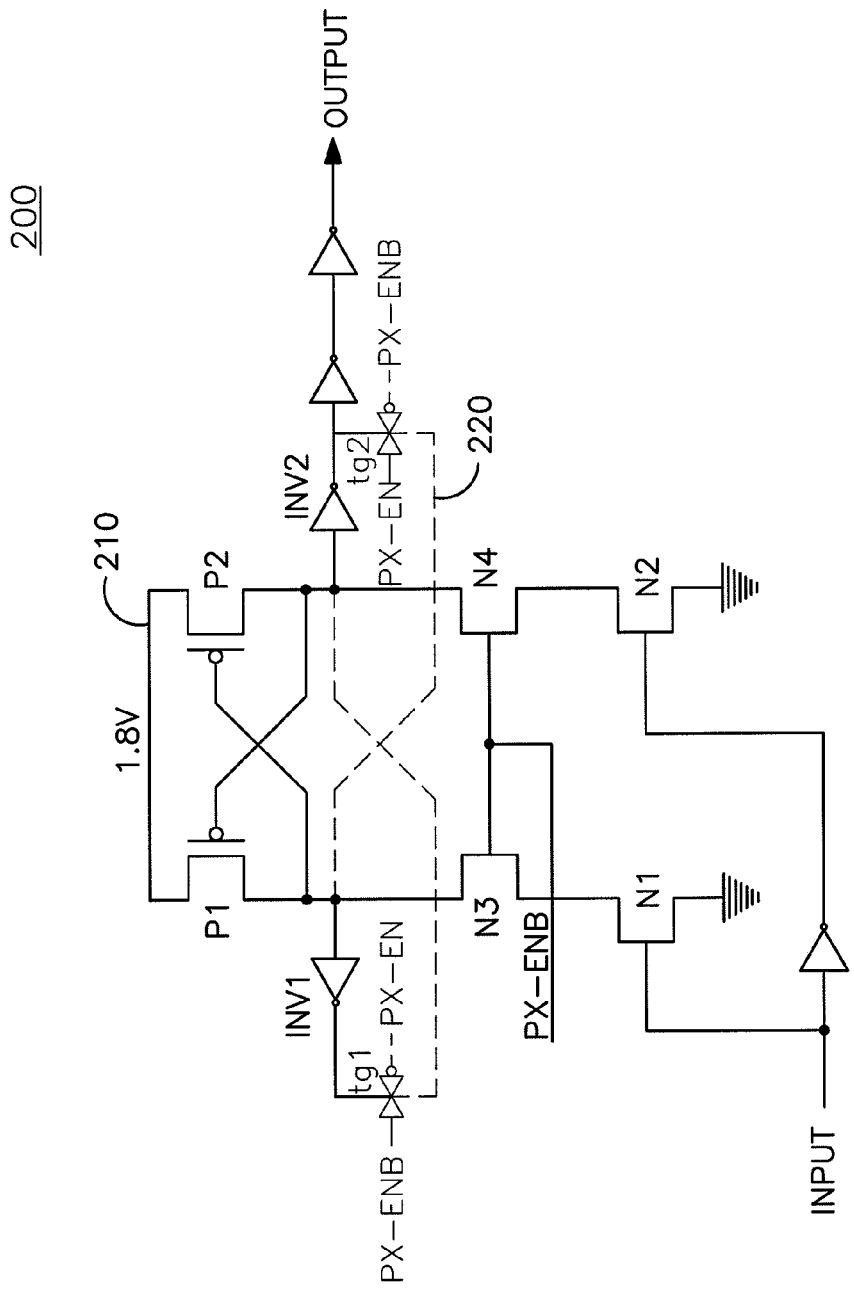
FIG. 3 shows the level shifter of FIG. 2 in the normal working state.

FIG. 3 shows the level shifter 200 when the PMOS/NMOS loop 210 is enabled and working under the normal state. The input is followed and translated to the output having a desired logic level. The inverter cross loop 220 is disabled, but ready to cut in to inherit the state from the PMOS/NMOS loop 210 whenever output latching is enabled by an external control. The inverter cross latch loop 220 may be disconnected by tg1 and tg2.

Inv2 is the path that the output of the PMOS/NMOS loop 210 travels. At higher frequencies with tighter duty cycle distortion applications, inv1 acts as a capacity load balance dummy that matches the capacity load of the drain of the P1 and P2 transistors. Tuning P1, P2, N1, N2, N3 and N4, and the PN ratio of inv2 generates reliable switching and minimized duty cycle distortion.

Figure 4:
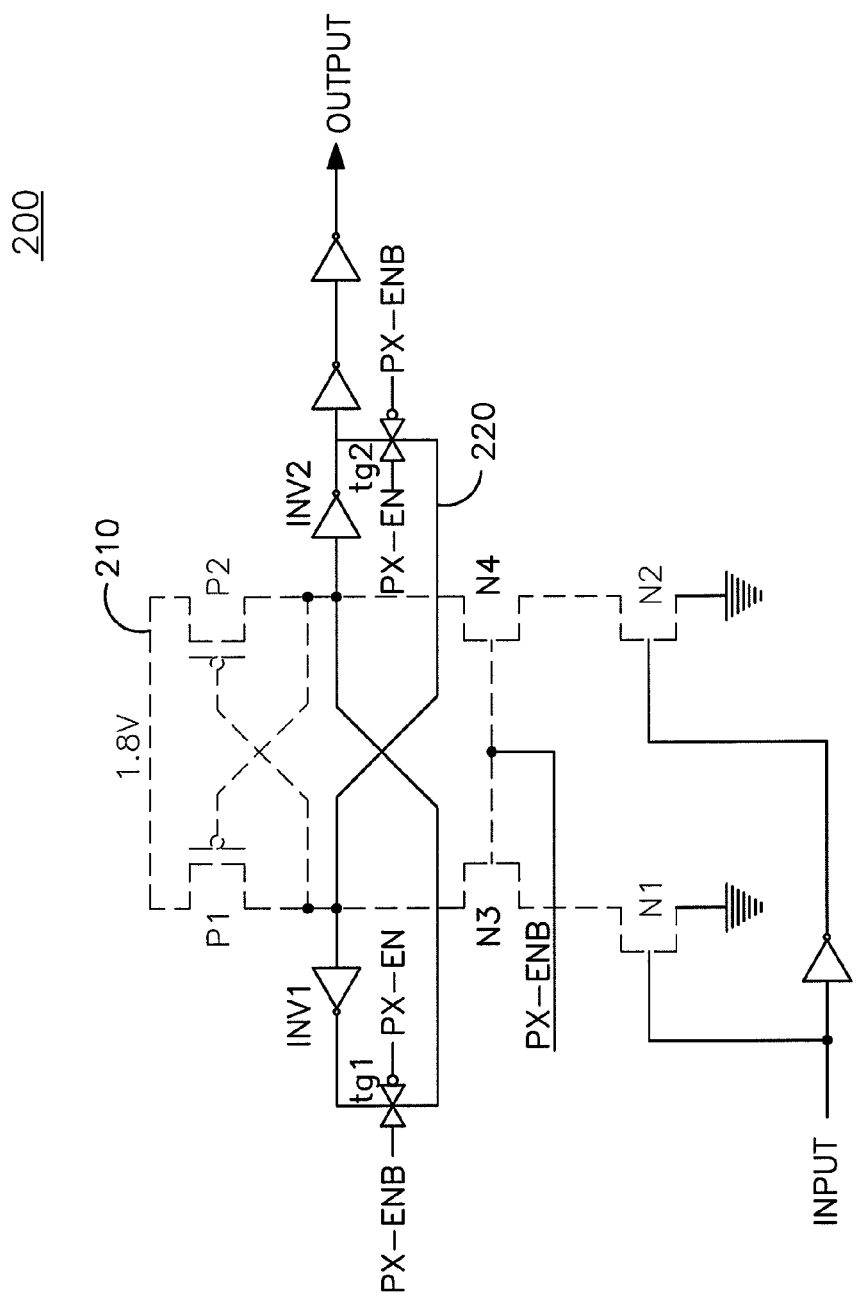
FIG. 4 shows the level shifter of FIG. 2 when the output latch signal is set.

Once the output latch enable signal is set, for example PX-En="1" and PX-ENB="0. The PX-EN signal may be received from a system level control block that determines and detects the chip working state. As a result of the setting of the latch enable signal, N3 and N4 are tuned off by the ground gate drive (PX-ENB). The path, therefore, from N1 and N2 is shutoff, which will be driven by input signals. By doing this, the input is isolated outside of the level transmission cross latch loop. FIG. 4 shows an example of the level shifter 200 when the output latch enable signal is set.

Since the PMOS/NMOS loop 210 and the inverter loop 220 are working in the same direction, inv1, inv2, which were closed by tg1 and tg2, inherit the state of the PMOS/NMOS loop (i.e., P1, P2, N1, N2, N3, N4). The output of the level shifter 200 is then driven by the latch state of the inverters inv1 and inv2. The input, therefore, has no effect on the output.

When restoring the level shifter 200 from the output latch state back to the normal working state, NMOS transistors N1 and N2 start to drive the PMOS/NMOS cross latch loop 210 with the conducting N3 and N4. N1 and N2 transistors are connected to the PMOS transistors through N3 and N4. Once N3 and N4 are driven by the gate and start to conduct, N1 and N2 have direct connection to the PMOS transistors and start to "drive" the loop. The state of the N1 and N2 are decided by the input signal. Because inv1 and inv2 are still latched to the previous state, driving the drain of P1 and P2 as expected from N1 and N2, the state will be transferred from the inverter loop 220 back to the PMOS/NMOS loop 210. Once the PMOS/NMOS loop 210 is fully in action (transistors N3 & N4 are fully turned on), the inverter loop 220 will completely fade out (tg1 and tg2 are fully turned off). This transition from the inverter loop 220 to the PMOS/NMOS loop 210 occurs when the input is the same as the output.

When the input is different from the previous latched state at the moment of restoring the level shifter 200 back to normal working condition, transistors N1 and N2 drive the PMOS/NMOS loop 210 in a different direction as the inverter cross loop 220 is maintained. However, because the PMOS/NMOS latching power has been increasing with the turning on of the transistors N3 & N4, and the inverter cross latch loop 220 latching power is decreasing with the turning off of the transmission gates tg1 and tg2, N1 and N2 may over come the previously maintained state and set a new state.

Because inverter inv1 and inv2 will be cut outside by tg1 and tg2, N1 and N2 don't need to be over driven too much, which means smaller transistor size and smaller area. Also, because tg1 and tg2 are only needed to maintain the static state instead of conducting considerable amount of dynamic current, a minimum size transistor could be safely here, lead to small silicon area.

Figure 5:
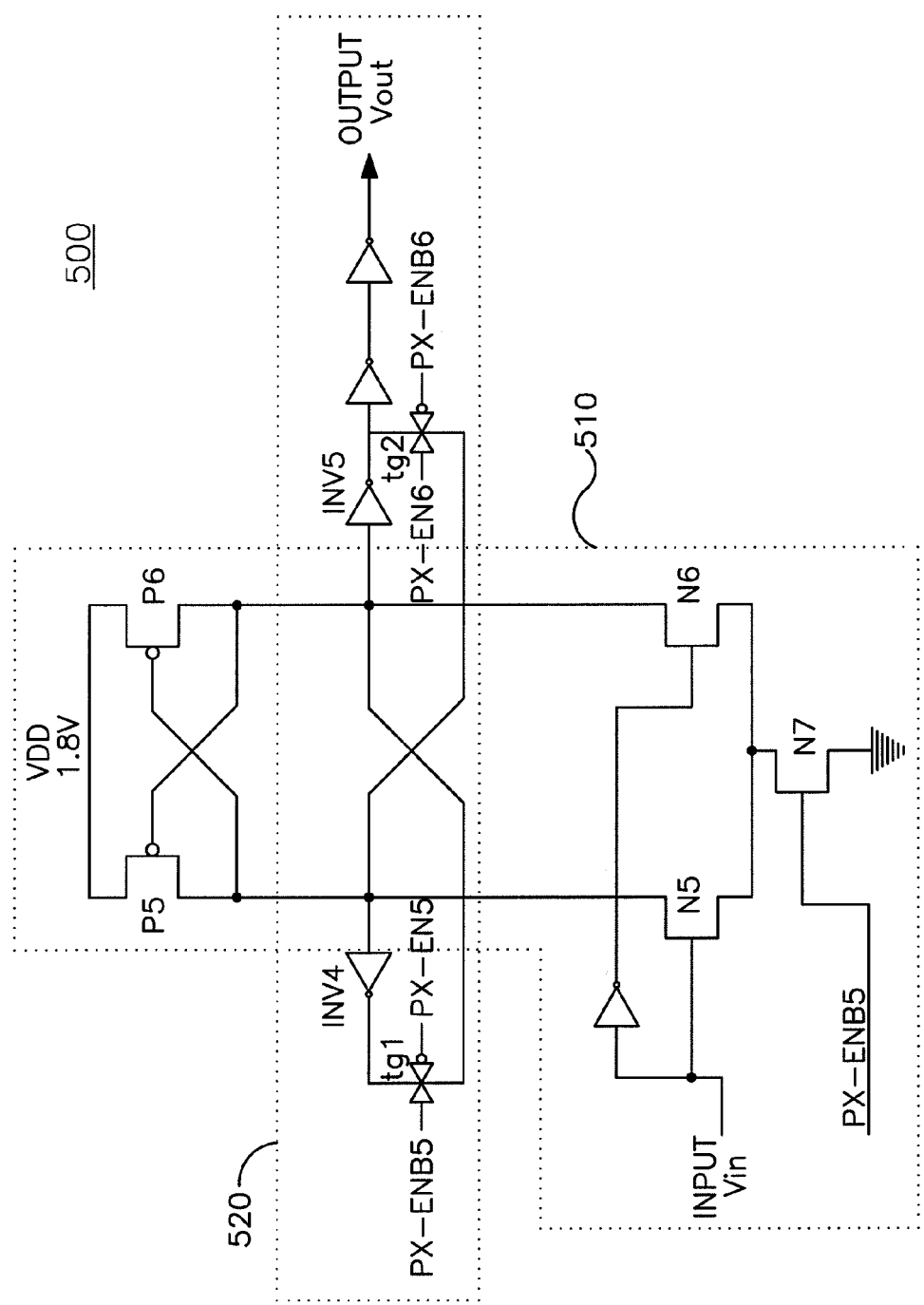
FIG. 5 shows an example of an alternative dual loop level shifter.

An alternative level shifter 500 is shown in FIG. 5. The level shifter 500 comprises a PMOS/NMOS loop 510 including PMOS transistors P5, P6 and NMOS transistors N5, N6 and N7, an inverter loop including inverters inv3, inv4, and transmission gates tg3 and tg4. In operation, the level shifter 500 operates similar to the level shifter 200 disclosed above. The N7 transistor though is used to disconnect the PMOS/NMOS 510 loop from the input, which is triggered by PX-ENBS, targeting at the different control transistors.

In another alternative, the inverter cross latch loop may be the main working latch loop and the PMOS/NMOS cross latch loop the maintenance loop.

The disclosed level shifter uses a single loop in the normal working state and therefore is able to be easily tuned and has a good duty cycle distortion. The disclosed level shifter also requires less current and power when working under high switching frequency than do current designs.

The inverters in the disclosed inverter loop of the level shifter serve as the capacity load balance for the PMOS/NMOS cross loop. Transistor reuse saves silicon area and makes the design less complicated. Because inverter cross latch loop is used in the output latching state, the transmission gates allow for the level shifter to include smaller sized transistors.

The level shifter also prevents the glitch and uncertainty when the shifter restores from the output latch state back to the normal working condition. As indicated above, the two loops are working in the same latch direction. Accordingly, when the level shifter is restored from the output latching state, the inverter cross latch loop maintains and transfers the state to the upcoming PMOS/NMOS latch loop until the inverter cross latch loop is disconnected by the transmission gate. For example, the inverter loop inherits the state when entering the output latching state from the PMOS/NMOS cross latch loop, and the PMOS/NMOS cross latch loop inherits the fixed state from the inverter cross latch loop in the restoring process. No uncertainty, glitch, reset or extra timing are required. Therefore, the restore process is smooth and instant.

The disclosed dual loop level shifter may be implemented on an integrated circuit, such as an application specific integrated circuit (ASIC), multiple integrated circuits, logical programmable gate array (LPGA), multiple LPGAs, discrete components, or a combination of integrated circuit(s), LPGA(s), and discrete component(s).

What is claimed is:

1. A level shifter configured to control one or more input output (I/O) pads comprising:
    a first latch loop configured to translate an input signal to an output signal having a desired logic level;
    a second latch loop, integrated with the first latch loop, configured to inherit a state of the first latch loop when a latching indication is received; and
    the second latch loop having an inverter loop including a first inverter having an input and an output that are respectively selectively coupled to an output and an input of a second inverter such that the inverter loop has an enabled state that is reflective of receipt of the latching indication where the first and second inverters are connected to each other and a disabled state where the first and second inverters are not connected to each other.

2. The level shifter of claim 1, wherein the second latch loop is disabled until the latching indication is received.

3. The level shifter of claim 2, wherein:
    the first latch loop is configured to switch off when the latching indication is received, thereby isolating the input signal from the output signal; and
    the second latch loop is configured to drive the output signal at the desired logic level when the first latch loop is off.

4. The level shifter of claim 3, wherein the first latch loop is a PMOS/NMOS cross latch loop.

5. The level shifter of claim 4, wherein the PMOS/NMOS latch loop comprises:
    a first PMOS transistor connected in series to a first NMOS transistor;
    a second PMOS transistor and a second NMOS transistor connected to the first PMOS transistor and the first NMOS transistor in a latch form, the second PMOS transistor connected in series to the second NMOS transistor;
    a third NMOS transistor having a gate connected to receive the input signal and a drain connected to in series to the first NMOS transistor; and
    a fourth NMOS transistor having a gate connected to the input signal by a first inverter and a drain connected to the second NMOS transistor.

6. The level shifter of claim 5, wherein a gate of the first NMOS transistor and a gate of the second NMOS transistor are connected to a ground gate drive.

7. The level shifter of claim 6, wherein:
the first inverter is connected in series between the first PMOS transistor and first NMOS transistor;
a first transmission gate is connected to the first inverter and connected in series between the second PMOS transistor and the second NMOS transistor;
the second inverter is connected to the first transmission gate in series between the second PMOS transistor and the second NMOS transistor and connected to a second transmission gate;
the second transmission gate connected to the first inverter in series between the first PMOS transistor and first NMOS transistor, and connected to receive the latching indication.

8. The level shifter of claim 7, wherein the first inverter and the second inverter selectively drive the output of the level shifter.

9. The level shifter of claim 8, wherein the first NMOS and second NMOS transistors start to drive the PMOS/NMOS latch loop when restoring the level shifter back to a normal working state,
the normal working state including the PMOS/NMOS latch loop translating the input signal to the output signal.

10. The level shifter of claim 9, wherein the second latch loop is turned off once the first NMOS and second NMOS are driving the first PMOS and second PMOS.

11. A method for controlling one or more input output (I/O) pads comprising:
translating an input signal to an output signal having a desired logic level using a first latch loop where a second latch loop, integrated with the first latch loop, outputs the output signal, the second latch loop having an inverter loop including a first inverter having an input and an output that are respectively selectively coupled to an output and an input of a second inverter such that the inverter loop has an enabled state that is reflective of receipt of a latching indication where the first and second inverters are connected to each other and a disabled state where the first and second inverters are not connected to each other; and
maintaining a state of the first latch loop based upon receipt of the latching indication.

12. The method of claim 11 further comprising disabling the second latch loop until receiving the latching indication.

13. The method of claim 11 further comprising:
isolating the input signal by disabling the first latch loop when the latching indication is received; and
driving the output signal at the desired logic level using the second latch loop when the input signal is isolated.

14. The method of claim 13 further comprising restoring the first latch loop by increasing the latching power of the first latch loop with the input signal and decreasing the latching power of the second latch loop.

15. The method of claim 11, wherein the first latch loop is a PMOS/NMOS latch loop.

16. The method of claim 11, wherein the first inverter and the second inverter selectively drive the output signal.

* * * * *